United States Patent
Akari et al.

(10) Patent No.: US 8,808,858 B2
(45) Date of Patent: Aug. 19, 2014

(54) DIAMONDLIKE CARBON HARD MULTILAYER FILM FORMED BODY AND METHOD FOR PRODUCING THE SAME

(75) Inventors: Koichiro Akari, Takasago (JP); Akitoshi Oota, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 980 days.

(21) Appl. No.: 12/484,521

(22) Filed: Jun. 15, 2009

(65) Prior Publication Data

US 2009/0250338 A1 Oct. 8, 2009

Related U.S. Application Data

(62) Division of application No. 11/467,828, filed on Aug. 28, 2006, now abandoned.

(30) Foreign Application Priority Data

Sep. 5, 2005 (JP) ................................ 2005-257083

(51) Int. Cl.
*B32B 9/00* (2006.01)

(52) U.S. Cl.
USPC .......................................... 428/408; 423/448

(58) Field of Classification Search
USPC ................ 428/408; 423/447.1, 448
See application file for complete search history.

(56) References Cited

U.S. PATENT DOCUMENTS

| 5,707,717 | A | 1/1998 | Shibahara et al. | |
|---|---|---|---|---|
| 6,562,445 | B2 * | 5/2003 | Iwamura | ........................ 428/217 |

(Continued)

FOREIGN PATENT DOCUMENTS

| JP | 5-117087 | 5/1993 |
|---|---|---|
| JP | 5-202477 | 8/1993 |

(Continued)

OTHER PUBLICATIONS

A. A. Voevodin, et al., "Design of a Ti/TiC/DLC functionally gradient coating based on studies of structural transitions in Ti-C thin films", Thin Solid Films, vol. 298, No. 1-2, XP-004125924, Apr. 20, 1997, pp. 107-115.

W. S. Jung, et al., "The synthesis of W-Ti-C films with a control of element composition by hybrid system", Surface & Coatings Technology, vol. 200, No. 1-4, XP-005063610, Oct. 1, 2005, pp. 721-725.

*Primary Examiner* — Daniel H Miller

(74) *Attorney, Agent, or Firm* — Oblon, Spivak, McClelland, Maier & Neustadt, L.L.P.

(57) ABSTRACT

A diamondlike carbon hard multilayer formed film body comprises a substrate, a diamondlike carbon film mainly composed of diamondlike carbon, and an intermediate layer between the substrate and the diamondlike carbon film. The diamondlike carbon film is composed of, in order from the substrate side, a first diamondlike carbon film and a second diamondlike carbon film. The surface hardness of the first diamondlike carbon film is within the range from not less than 10 GPa to not more than 40 GPa based on nanoindentation test, and the surface hardness of the second diamondlike carbon film is within the range from more than 40 GPa to not more than 90 GPa based on nanoindentation test. According to such a structure, even if a DLC multilayer containing high-hardness DLC film on the outermost surface side is formed in a thickness of not less than about 3 μm on a substrate of a wide range extending from a material with high hardness such as cemented carbide to an iron-based material with low hardness, excellent adhesion to both the substrate and the DLC film can be ensured in addition to excellent wear resistance.

20 Claims, 3 Drawing Sheets

(56) References Cited

U.S. PATENT DOCUMENTS

| | | |
|---|---|---|
| 6,705,806 B2 | 3/2004 | Okamura et al. |
| 6,716,540 B2 | 4/2004 | Kohara et al. |
| 2002/0136895 A1 | 9/2002 | Kohara et al. |

FOREIGN PATENT DOCUMENTS

| | | |
|---|---|---|
| JP | 2000-87218 | 3/2000 |
| JP | 2000-119843 | 4/2000 |
| JP | 2003-171758 | 6/2003 |

* cited by examiner

DIAMONDLIKE CARBON HARD MULTILAYER FILM FORMED BODY AND METHOD FOR PRODUCING THE SAME

BACKGROUND OF THE INVENTION

1. Field of the Invention

The present invention relates to a hard multilayer film formed body which has a diamondlike carbon film on the outermost layer side, and a method for producing the same. The diamondlike carbon hard multilayer film formed body according to the present invention is suitably used for a surface protective film for a member which especially requires wear resistance in automobile parts, machine parts, precision tools, cutting tools, because it exhibits excellent adhesiveness to a substrate.

2. Description of the Related Art

Diamondlike carbon (hereinafter referred to as "DLC") is amorphous carbon having intermediate properties between diamond and graphite, and called hard carbon, hard amorphous carbon, amorphous carbon, delmorphous carbon, i-carbon, diamond-shape carbon or the like. The DLC is used, for example, as a protective film for a member which requires wear resistance because of high hardness as well as diamond and excellent characteristics of wear resistance, solid lubricity, thermal conductivity and chemical stability.

Physical vapor deposition (PVD) such as sputtering or ion plating, and chemical vapor deposition (CVD) are adapted as a method for forming a DLC film. Particularly, a DLC film formed by cathode discharge type arc ion plating (hereinafter referred to as AIP) which uses solid carbon as an evaporation source (carbon target) is applied to the field of cutting tools and the like which especially require wear resistance, because it contains no hydrogen and can have high hardness close to diamond, compared with a DLC film formed by CVD. However, a DLC film with high hardness has an extremely large internal stress, and its deformability is extremely small. Therefore, it has a disadvantage of easily separating with low adhesiveness to the substrate. Therefore, it has been proposed for improving the adhesiveness to the substrate to extremely minimize the thickness of the DLC film with high hardness to about 0.1 µm.

The present inventors disclose Japanese Patent Laid-Open No. 2000-87218 as a method for improving the adhesiveness of DLC film formed by AIP, wherein a DLC film is formed on a surface of a metallic or ceramic substrate by cathode discharge type ion plating using a carbon target, and a mixed layer 10 to 500 Å in thickness composed of the substrate constituting elements and the film constituting elements is formed in the interface between the DLC film and the substrate. The mixed layer is formed by controlling application voltage to −400 to −5000V and vacuum degree to not more than 10 mTorr in DLC film formation, whereby the mixing effect of carbon (C) ion that is the DLC film forming material is enhanced. The adhesiveness to DLC film can be further enhanced by forming an intermediate layer 10 to 1000 Å in thickness comprising at least one element selected from the group consisting of Ti, Zr, Hf, V, Nb, Ta, Cr, Mo, W, Fe, Si and Al between the substrate and the DLC film, and forming a mixed layer 10 to 500 Å in thickness comprising these intermediate layer constituting elements and the DLC film constituting elements in the interface between the intermediate layer and the DLC film. Therefore, according to the above-mentioned method, a DLC hard film formed body (which may be hereinafter called DLC formed body) having a high-hardness DLC film formed with good adhesiveness can be obtained.

However, in this method, since the mixing effect of C is used for forming the mixed layer as described above, the thickness of the mixed layer is limited to a narrow range from about 10 to 500 Å. Therefore, a hardness difference is caused between the substrate and the DLC film (in a case having no intermediate layer) or between the intermediate layer and the DLC film (in a case having the intermediate layer), which are arranged through such a thin mixed layer. When the substrate is composed of a material with relatively high hardness such as cemented carbide material or ceramics, satisfactory adhesiveness can be exhibited because the hardness difference is relatively small. However, when the substrate is composed of a material with relatively low hardness such as an iron-based substrate, which is generally used for mechanical parts, easy separation of DLC film becomes problematic. When the thickness of a multilayer film containing DLC film on the outermost surface side (a multilayer film including the intermediate layer and the DLC film, which may be hereinafter called DLC multilayer film) is as thick as not less than about 3 µm, this problem becomes noticeable because the whole stress of the DLC multilayer film is increased.

On the other hand, the present inventors disclose DLC hard multilayer film formed bodies comprising a predetermined intermediate layer between the substrate and the DLC film, which are formed using unbalanced magnetron sputtering (which may be hereinafter called UBM sputtering or UBMS) (Japanese Patent Laid-Open (JP) No. 2000-119843, U.S. Pat. No. 6,716,540, and Japanese Patent Laid-Open (JP) No. 2003-171758). The UBM sputtering forms an intermediate layer which can exhibit excellent adhesiveness to both the substrate and the DLC film, in addition to formation of a compact DLC film with high hardness.

General sputtering and UBM sputtering will be comparatively described in reference to FIGS. 3 and 4.

FIG. 3 is a schematic view showing a cathode structure for general sputtering. In the general sputtering, as shown in FIG. 3, ferrite magnets having the same magnetic property are disposed at the center and periphery of a circular target to form closed loops of magnetic lines of force in the vicinity of the target material. When a bias voltage is applied to a substrate, the substance constituting the target material is formed on the substrate. Although FIG. 4 shows an example using ferrite magnet, Sm-based rare earth magnet or Nd-based rare earth magnet can be used.

In the UBM sputtering, as shown in FIG. 4, magnets having different magnetic properties (ferrite magnet for the center and SmCo magnets for the periphery in FIG. 4) are disposed at the center part and periphery of a circular target, respectively. By disposing the different magnets in this way, a part of magnetic lines of force generated from the stronger magnet reaches as far as the vicinity of the substrate. As a result, plasma generated from sputtering along the magnetic lines of force (e.g., Ar plasma) is diffused as far as the vicinity of the substrate. According to the UBM sputtering, more Ar ions and electrons than those in general sputtering reach the substrate along the above-mentioned magnetic lines of force reaching as far as the vicinity of the substrate (ion-assist effect). Thus, the UBM sputtering can form a compact DLC film with high hardness. It further can form a homogeneous amorphous layer.

In the three related arts described above, as the intermediate layer to be arranged between the substrate and the DLC film, an intermediate layer of two-layer structure composed of, in order from the substrate side, a predetermined metal or a WC compound excellent in adhesiveness to the substrate and an amorphous containing this metal or WC compound and carbon (C) (JP No. 2000-119843 and U.S. Pat. No. 6,716, 540) and an intermediate layer of four-layer structure (JP No. 2003-171758) using UBM sputtering are disclosed. JP No. 2000-119843, U.S. Pat. No. 6,716,540 and JP No. 2003-171758 are differed in the kind of substrates and in the structure of intermediate layer.

Specifically, JP No. 2000-119843 describes an intermediate layer of two-layer structure provided between a substrate such as an insulating material such as cemented carbide, Si or Al2O3 and a DLC film, the intermediate layer being composed of in order from the substrate side, a metal layer (first layer) comprising at least one metal selected from the group consisting of W, Ta, Mo and Nb and an amorphous layer (second layer) containing at least one of the metals described above and carbon.

U.S. Pat. No. 6,716,540 and JP No. 2003-171758 were made from the viewpoint of providing a DLC formed body capable of covering DLC film with good adhesiveness even in use of iron-based substrate. U.S. Pat. No. 6,716,540 describes an intermediate layer of two-layer structure composed of, in order from the substrate side, a metal layer (first layer) of Cr and/or Al and an amorphous layer (second layer) containing at least one of the above-mentioned metals and carbon. JP No. 2003-171758 discloses a first intermediate layer composed of, in order from the substrate side, a metal layer (first layer) of Cr and/or Al, a mixed layer (second layer) of a metal of Cr and/or Al and at least one metal selected from the group consisting of W, Ta, Mo and Nb, a metal layer (third layer) of at least one metal selected from the group consisting of W, Ta, Mo and Nb, and an amorphous layer (fourth layer) containing at least one metal selected from the group consisting of W, Ta, Mo and Nb and carbon (C), and a second intermediate layer composed of, in order from the substrate side, a metal layer (first layer) of Cr and/or Al, a mixed layer (second layer) of a metal of Cr and/or Al and a compound mainly composed of WC, a compound layer (third layer) mainly composed of WC, and an amorphous layer (fourth layer) containing a compound mainly composed of WC and carbon (C). The DLC formed body described in U.S. Pat. No. 6,716,540 is excellent in adhesiveness to, particularly, an iron-based substrate with relatively high hardness such as high speed tool steel (HSS), while the DLC formed body described in JP No. 2003-171758 is excellent in adhesiveness to, particularly, an iron-based substrate with relatively low hardness such as bearing steel, stainless steel or carbon steel.

According to the methods described in JP No. 2000-119843, U.S. Pat. No. 6,716,540 and JP No. 2003-171758, since an adequate intermediate layer is arranged in accordance with the kind of substrate, a DLC formed body capable of exhibiting excellent adhesiveness to both the substrate and the DLC film can be obtained even if a relatively thick DLC multilayer film is formed.

However, it is principally difficult for the sputtering including UBM sputtering to form a DLC film with extremely high hardness as in the AIP which uses carbon ion as a raw material. Therefore, the DLC film formed using the sputtering is inferior in wear resistance to the DLC film formed using AIP.

SUMMARY OF THE INVENTION

From the view of the above-mentioned circumstances, the present invention thus has an object to provide a DLC formed body which exhibits excellent adhesiveness to both the substrate and the DLC film in addition to excellent wear resistance, for example, even in a case that a DLC multilayer film containing a high-hardness DLC film on the outermost surface side is formed in a thickness of about 3 µm or more to the substrates of a wide range extending from a high-hardness material such as cemented carbide to a low-hardness iron-based material, and a method for producing the DLC formed body.

The diamondlike carbon hard multilayer film formed body according to the present invention which could attain the above-mentioned object comprises a substrate, a diamondlike carbon film mainly composed of diamondlike carbon and an intermediate layer between the substrate and the diamondlike carbon film, in which the diamondlike carbon film is composed of, in order from the substrate side, a first diamondlike carbon film and a second diamondlike carbon film, the surface hardness of the diamondlike carbon film is within the range from not less than 10 GPa to not more than 40 GPa based on nano indentation test, and the surface hardness of the second diamondlike carbon film is within the range from more than 40 GPa to not more than 90 GPa based on nano indentation test.

In the diamondlike carbon hard multilayer film formed body having the above structure, it is preferable that the surface hardness of the second diamondlike carbon film increases stepwise or continuously from the interface side between the first diamondlike carbon film and the second diamondlike carbon film toward the outermost layer side of the second diamondlike carbon film.

In the diamondlike carbon hard multilayer film formed body having the above structure, the substrate may be composed of a cemented carbide material, and the intermediate layer may be composed of, in order from the substrate side, a first metal layer comprising at least one metal selected from the group consisting of W, Ta, Mo and Nb, and an amorphous layer containing at least one metal selected from the group consisting of W, Ta, Mo and Nb, and C.

In the diamondlike carbon hard multilayer film formed body having the above structure, otherwise, the substrate may be composed of an iron-based substrate, and the intermediate layer may be composed of, in order from the substrate side, a second metal layer comprising Cr and/or Al, a composite metal layer comprising a metal of Cr and/or Al and at least one metal selected from the group consisting of W, Ta, Mo and Nb, a first metal layer comprising at least one metal selected from the group consisting of W, Ta, Mo and Nb, and an amorphous layer containing at least one metal selected from the group consisting of W, Ta, Mo and Nb, and C.

In the diamondlike carbon hard multilayer film formed body having the above structure, it is preferable that the thickness of the intermediate layer is within the range from not less than 10% to not more than 50% relative to the total thickness of the diamondlike carbon hard multilayer film formed body, and the thickness of the second diamondlike carbon film is within the range from not less than 50% to not more than 90% relative to the total thickness of the diamondlike carbon hard multilayer film formed body except the intermediate layer.

The method for producing a diamondlike carbon hard multilayer film formed body according to the present invention which could the above-mentioned object is a method for producing any one of the above-mentioned diamondlike carbon hard multilayer film formed bodies, comprising the steps of:

(a) preparing a substrate;

(b) forming an intermediate layer on the substrate by sputtering;

(c) forming a first diamondlike carbon film on the intermediate layer by sputtering; and (d) forming a second diamondlike carbon film on the first diamondlike carbon film by cathode discharge type arc ion plating.

In the above-mentioned method for producing a diamondlike carbon hard multilayer film formed body, a composite type coating device having a sputtering evaporation source and a cathode discharge type arc ion plating evaporation source provided within one vacuum chamber is used in the steps (b), (c) and (d).

In the method for producing a diamondlike carbon hard multilayer film formed body, it is preferable that the step (b) includes a forming process by unbalanced magnetron sputtering.

In the method for producing a diamondlike carbon hard multilayer film formed body, it is preferable that the step (c) includes a forming process step by unbalanced magnetron sputtering.

In the method for producing a diamondlike carbon hard multilayer film formed body, it is preferable that the composite type coating device comprises an unbalanced magnetron sputtering evaporation source.

The diamondlike carbon hard multilayer film formed body of the present invention is remarkably enhanced in adhesiveness between the substrate and the DLC film and also excellent in wear resistance because of the above-mentioned structure. According to the present invention, excellent adhesiveness and wear resistance can be ensured even if a DLC multilayer film containing DLC film as an outermost surface layer is formed in a thickness of not less than about 3 μm on substrates of a wide range extending from cemented carbide to iron-based material with low hardness.

DETAILED DESCRIPTION OF THE PREFERRED EMBODIMENTS

Figure 1:
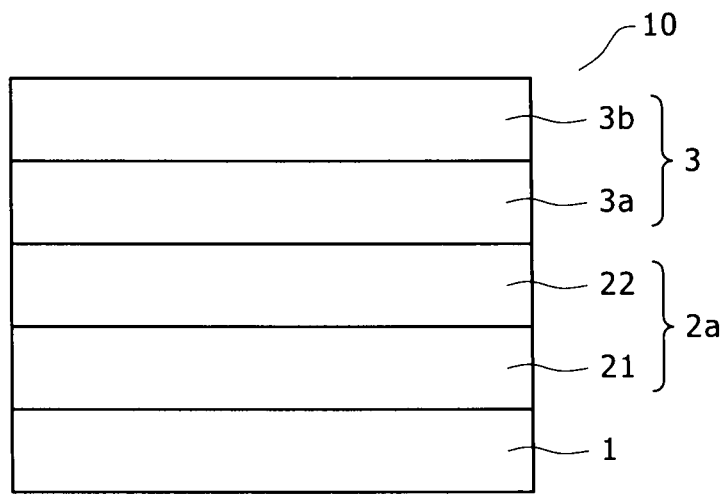
FIG. 1 is a schematic sectional view showing the structure of a first formed body according to the present invention.

The present inventors earnestly studied, paying attention to AIP and sputtering, for the purpose of providing a DLC formed body which exhibits excellent adhesiveness to both DLC film and substrate in addition to excellent wear resistance even if a DLC multilayer film is formed thickly regardless of the kind of substrates.

As described above, although the AIP can form a DLC film with high hardness, particularly, on a high-hardness substrate such as cemented carbide with good adhesiveness while ensuring satisfactory wear resistance, adhesiveness to, for example, an iron-based substrate with low hardness or the like is insufficient. Further, it has the problem that formation of a thick DLC multilayer film of about 3 μm or more results in reduction in adhesiveness. On the other hand, the sputtering such as UBM sputtering can form a DLC formed body which can exhibit excellent adhesiveness to both substrate and DLC film by forming an adequate intermediate layer according to the kind of substrates as shown in JP No. 2000-119843, U.S. Pat. No. 6,716,540, and JP No. 2003-171758, while it has a problem of defective wear resistance because it is difficult to form a DLC film with high hardness.

The present inventors made studies for providing a high-hardness DLC formed body having both adhesiveness and wear resistance by utilizing characteristics of the film forming processes by AIP and sputtering. As a result, the inventors found that the expected purpose can be successfully achieved if a composite process for forming, in a DLC film having a two-layer structure differed in hardness, an intermediate layer and a DLC film with low hardness (referred to as first DLC film) provided on the intermediate layer side by the sputtering, and forming a DLC film with high hardness (referred to as second DLC film) provided on the outermost layer side by the AIP is adapted, and completed the present invention.

The DLC formed body of the present invention is characterized in that, as the DLC film, a two-layer DLC film composed of the first DLC film with low hardness and the second DLC film with high hardness are provided with good adhesiveness. A predetermined intermediate layer capable of exhibiting excellent adhesiveness to both the substrate and the DLC film is provided between the substrate and the DLC film according to the kind of substrates. As the intermediate layer, for example, the intermediate layers described in JP No. 2000-119843, U.S. Pat. No. 6,716,540, and JP No. 2003-171758 are used.

Preferred embodiments of the DLC formed body according to the present invention will be described in reference to the drawings. Although an example of the intermediate layers described in JP No. 2000-119843 and JP No. 2003-171758 is used for illustration in the following preferred embodiments, the kind of intermediate layers is not limited to this. For example, the intermediate layer described in U.S. Pat. No. 6,716,540 is effective for use of an iron-based material with relatively high hardness such as high-speed tool steel. In Embodiment 2, the second intermediate layer described in JP No. 2003-171758 can also be used.

Embodiment 1

A first embodiment of the DLC formed body according to the present invention (referred to as first DLC formed body) is described in reference to FIG. 1. The first DLC formed body is useful, for example, for use of a substrate with relatively high hardness such as cemented carbide material, and the intermediate layer described in JP No. 2000-119843 is typically used as the intermediate layer.

A first DLC formed body 10, as shown in FIG. 1, comprises a substrate 1, a diamondlike carbon film mainly composed of diamondlike carbon (DLC film) 3, an intermediate layer 2 between the substrate 1 and the DLC film 3 (which may be called a first intermediate layer 2a for discrimination from a second intermediate layer described later).

The DLC film 3 is composed of, in order from the substrate 1 side, a first DLC film 3a and a second DLC film 3b, with the surface hardness of the first DLC film 3a being within the range from not less than 10 GPa to not more than 40 GPa based on nano indentation test (described in the column of examples) and the surface hardness of the second DLC film 3b being within the range from more than 40 GPa to not more than 90 GPa based on nano indentation test. Since the first DLC film 3a is formed by sputtering (preferably, by UBM sputtering), and the second DLC film 3b by AIP as described in detail later, a high-hardness DLC film excellent in adhesiveness to the intermediate layer can be formed on the outermost surface side.

The surface hardness of the first DLC film 3a is controlled within the range from not less than 10 GPa to not more than 40 GPa to enhance the adhesiveness to the intermediate layer 2a, preferably, within the range from not less than 20 GPa to not more than 30 GPa. The surface hardness of the second DLC film 3b is controlled within the range from more than 40 GPa to not more than 90 PGa to ensure expected wear resistance, preferably, within the range from not less than 50 GPa to not more than 80 GPa.

The surface hardness of the second DLC film 3b preferably increases stepwise or continuously from the interface side between the first DLC film 3a and the second DLC film 3b toward the outermost surface layer of the second DLC film 3b. According to this, the adhesiveness between the first DLC film 3a and the second DLC film 3b can be further enhanced.

The first DLC film 3a may be composed of only DLC, but can include at least one metal selected from the group consisting of W, Ta, Mo, Nb, Cr and Al (a first metal and a second metal used in the intermediate layer). According to this, since the internal stress of the first DLC film 3a itself is moderated to improve the follow-up property to deformation of the substrate 1 as well as further improvement in toughness, the separation of the DLC film 3 can be suppressed. The above-mentioned metal is preferably contained in the DLC film within the range from not less than 5 atomic % to not more than 20 atomic %. When not less than 5 atomic % of the metal is added, the stress moderating effect can be effectively exhibited. However, since excessive addition of the metal causes excessive reduction in hardness of the DLC film 3a, the upper limit is preferably set to 20 atomic %.

The structure of the intermediate layer 2a will be described.

The intermediate layer 2a used in this embodiment has a two-layer structure consisting of, in order from the substrate 1 side, a first metal layer 21 (first layer) and an amorphous layer 22 (second layer) described below. In this specification, for convenience, a layer comprising at least one metal (first metal) selected from the group consisting of W, Ta, Mo and Nb is referred to as "first metal layer", and a layer comprising metal of Cr/Al (second metal) to as "second metal layer".

The first layer is the layer 21 composed of the first metal comprising at least one metal selected from the group consisting of W, Ta, Mo and Nb. The first metal layer 21 may contain the first metal independently, or may be a mixed layer containing two or more thereof. Otherwise, it may be an alloy layer in which part of the first metal is alloyed.

The second layer is the amorphous layer 22 containing at least one metal selected from the group consisting of W, Ta, Mo and Nb, and C. The second layer may contain the first metal independently, or may contain two or more thereof in combination. The amorphous layer means the layer where no crystal phase or fine deposit layer can be confirmed in transmission electron microscopic observation (magnification: about 100,000-fold). According to the present invention, since the amorphous layer composed of the first metal such as W, which forms the first layer, and C is formed without formation of a fragile carbide layer, the internal separation or breakage of the intermediate layer 2a can be prevented. Further, since the DLC film 3 which forms the outermost surface layer is also amorphous, the adhesiveness between the DLC film 3 and the amorphous layer 22 can also be ensured.

The concentration of the first metal (and carbon concentration) which forms the amorphous layer 22 may be substantially constant. However, the first metal preferably decreases stepwise or continuously from the substrate 1 side toward the DLC film 3 (surface layer side) (in other words, the carbon concentration increases from 0% to 100%). According to this, since the mechanical characteristics of the DLC formed body 10 composed of a multilayer film change stepwise or continuously from the substrate 1 side toward the DLC film 3, separation caused by local stress concentration accompanying thermal shock or the like can be effectively prevented.

In this embodiment, the kinds of metals forming the first layer and the second layer may be the same or different as long as the above requirements are satisfied. Since the first metal used for the first layer is W, Ta, Mo or Nb, for example, a metal layer 21 composed of W and an amorphous layer 22 composed of Ta and C may be employed as the first layer and the second layer, respectively, and in this case, also, the above-mentioned effect is exhibited. In order to ensure a further excellent effect, the first layer and the second layer are preferably formed so as to contain the same kind of metals, and further preferably formed of the same kind of metals. For example, it is preferable that the first layer is a metal layer 21 composed of W, and the second layer is an amorphous layer 22 composed of W, Ta and C, and it is further preferable that the first layer is a metal layer 21 composed of W, and the second layer is an amorphous layer 22 of W and C as shown in an example described later.

The thickness of the first intermediate layer 2a (the total thickness of the first layer and the second layer) is preferably set substantially within the range from not less than 10% to not more than 50% relative to the total thickness of the DLC multilayer film (the multilayer film composed of the intermediate layer 2a and the DLC film 3). According to this, excellent adhesiveness between the substrate 1 and the DLC film 3 can be ensured without impairing the effect of the intermediate layer 2a and the DLC film 3.

The thickness of the second DLC film 3b is preferably set substantially within the range from not less than 50% to not more than 90% relative to the total thickness of the DLC multilayer film except the intermediate layer (or the total thickness of the first DLC film 3a and the second DLC film 3b). According to this, the wear resistance of the DLC multilayer film can be enhanced.

In this embodiment, a stress relaxation layer (not shown) composed of carbon may be provided between the amorphous layer 22 (second layer) and the first DLC film 3a. By providing such a stress relaxation layer composed of C, the stress concentrated to the interface between the amorphous layer 22 and the first DLC film 3a can be relaxed to further improve the adhesiveness. In order to effectively exhibit the effect of the stress relaxation layer, the thickness of the stress relaxation layer is preferably set substantially within the range of about 20 to 80% of the thickness of the first DLC film 3a.

The hardness of the stress relaxation layer preferably increases stepwise or continuously from the first metal layer (first layer) 21 toward the DLC film 3. Concretely, the hardness of the stress relaxation layer is preferably close to that of the amorphous layer 22 in the interface with the amorphous layer 22, increases stepwise or continuously toward the surface layer side of the first DLC film 3a, and is substantially identical to the surface hardness of the first DLC film 3 in the interface with the first DLC film 3. The difference in interface hardness between the stress relaxation layer and the amorphous layer 22 at the interface between the both is preferably about not more than 10 GPa. According to this, since the stress concentrated to the interface of the adjacent layers can be minimized, the adhesiveness is further improved.

The first DLC formed body preferably further comprises a diffusion layer between the substrate 1 and the first metal layer 21 (first layer). According to this, the adhesiveness between the substrate 1 and the first layer is further improved.

As the substrate 1, for example, cemented carbide, thermet, insulating materials such as SiC or $Al_2O_3$, ceramic materials (with about 1500 Hv to 2000 Hv by Vickers hardness) and the like are used.

Embodiment 2

Figure 2:
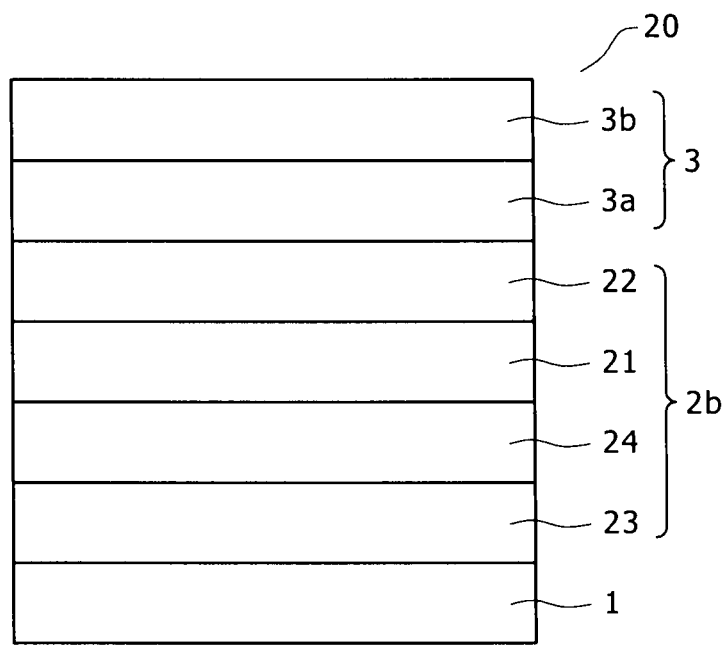
FIG. 2 is a schematic sectional view showing the structure of a second formed body according to the present invention.
Figure 3:
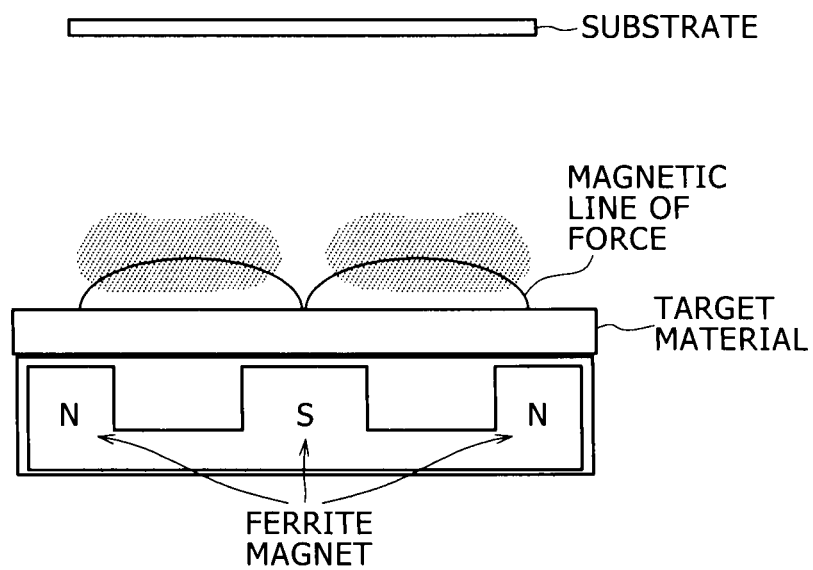
FIG. 3 is a schematic descriptive view showing a cathode structure in general sputtering.
Figure 4:
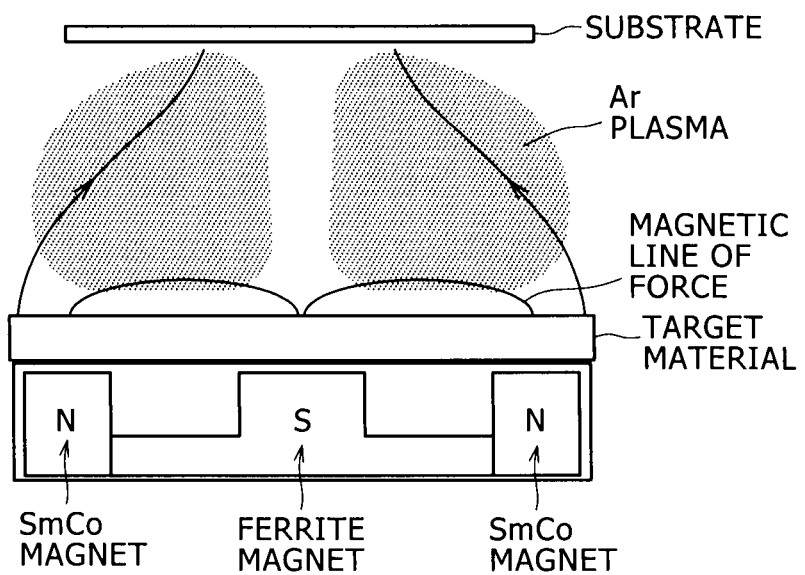
FIG. 4 is a schematic descriptive view showing a cathode structure in UBM sputtering.

A second embodiment of the DLC formed body according to the present invention (second DLC formed body) will be described in reference to FIG. 2. In FIG. 2, the same reference numbers as in FIG. 1 are assigned to parts overlapping with those of the first DLC formed body.

The second formed body is differed from the first formed body in the point that the intermediate layer is composed of four layers, and an iron-based material (preferably, a material with relatively low hardness such as bearing steel) is used as the substrate, as described below in detail. As the intermediate layer to be used in the second formed body, the intermediate layer described in JP No. 2003-171758 is typically given. Compared with the intermediate layer in the first DLC formed body, the third layer (metal layer) and the fourth layer (amorphous layer) in the second DLC formed body correspond to the first layer and the second layer in the first DLC formed body, respectively. Detailed descriptions for the parts overlapping with those in the first DLC formed body (the third layer, the fourth layer, and the DLC film 3) are omitted.

As shown in FIG. 2, a second DLC formed body 20 according to the present invention comprises a substrate 1, a DLC film 3 mainly composed of DLC, and an intermediate layer 2b between the substrate 1 and the DLC film 3 (which may be called a second intermediate layer for discrimination from the intermediate layer in the first DLC formed body).

The intermediate layer 2b has a four-layer structure consisting of a second metal layer 23 (first layer) composed of Cr and/or Al, a composite metal layer 24 (second layer) composed of metal of Cr and/or Al and at least one metal selected from the group consisting of W, Ta, Mo and Nb, a first metal layer 21 (third layer) composed of at least one selected from the group consisting of W, Ta, Mo and Nb, and an amorphous layer 22 (fourth layer) containing at least one metal selected from the group consisting of W, Ta, Mo and Nb, and C.

According to this embodiment, since the Cr/Al metal layer (first layer) which is excellent in adhesiveness to an iron-based substrate is formed on the iron-based substrate side, and the amorphous layer (fourth layer) which contains the same amorphous C as DLC is formed on the DLC film side, excellent adhesiveness can be ensured to both the iron-based substrate and the DLC film. Since the second layer of the intermediate layer contains further the metal of Cr/Al which forms the first layer, the adhesiveness to the first layer is also excellent. Since the third layer further contains other metals (W, Ta, Mo and Nb) which form the second layer, the adhesiveness to the second layer is also excellent. Since the fourth layer further contains the other elements which form the third layer, the adhesiveness to the third layer is also excellent. The intermediate layer used in the present invention can ensure excellent adhesiveness even if the DLC multilayer film is formed in a thickness of 3 µm or more, since the component of each layer which forms the intermediate layer is regulated so as to ensure the adhesiveness to each layer to be formed above and under it, and also regulated so as not to cause separation or breakage in the inner part of the intermediate layer.

The first layer is a second metal layer 23 of Cr and/or Al. The second metal layer 23 is similar in mechanical characteristics or the like to the iron-based substrate 1, and can exhibit satisfactory adhesiveness to the iron-based substrate 1. The second metal layer 23 may contain Cr or Al independently, or may be a mixed layer containing both Cr and Al. Otherwise, it may be an alloy layer in which part of Cr and Al is alloyed.

The second layer is a composite metal layer 24 containing second metal (Cr/Al) which forms the first layer and first metal constituting the third layer (at least one metal selected from the group consisting of W, Ta, Mo and Nb). The first and second metals may be contained independently, or two or more thereof may be used in combination.

The concentration of the first metal which forms the composite metal layer 24 may be substantially constant. The content of the second metal preferably decreases stepwise or continuously from the iron-based substrate 1 side toward the DLC film 3 (surface layer side) (or the concentration of the second meal decreases from 100 to 0%). According to this, the mechanical characteristics of the composite metal layer 24 can be changed stepwise or continuously from the first layer side to the third layer side, and consequently, separation caused by local thermal stress by thermal shock or the like can be effectively prevented.

The descriptions for the third layer and the fourth layer are omitted.

The thickness of the second intermediate layer 2b is preferably controlled in the same manner as in the first DLC formed body.

In the second DLC formed body, also, a stress relaxation layer (not shown) is preferably further formed between the amorphous layer 22 (fourth layer) and the DLC film 3 in the same manner as in the first DLC formed body. A diffusion layer (not shown) may be further provided at least any one of between the substrate 1 and the second metal layer 23 (first layer), between the second metal layer 23 (first layer) and the composite metal layer (second layer) 24, between the composite metal layer 24 (second layer) and the first metal layer 21 (third layer), and between the first metal layer 21 (third layer) and the amorphous layer 22 (fourth layer). The description therefor is omitted since the details are substantially the same as in the first DLC formed body.

As the iron-based substrate 1, any iron-based material can be used without particular limitation, including both an iron-based material with relatively high hardness (Vickers hardness of about 900 Hv) such as high-speed tool steel, and a low-hardness iron-based material with Vickers hardness of about 200 Hv to 800 Hv. In the present invention, use of iron-based materials with low hardness is preferred, for example, including bearing steel, stainless steel, carbon steel and the like which are lower in hardness than high-speed tool steel.

In the above, the second DLC formed body according to the present invention was described.

The method for producing the first and second DLC formed bodies according to the present invention will be then described. As described above, since the first and second DLC formed bodies are identical except the difference in the kind of substrates and the structure of intermediate layer, methods for producing these formed bodies are collectively described.

The method for producing a DLC formed body according to the present invention comprises the steps of (a) preparing a substrate 1; (b) forming an intermediate layer 2 on the substrate 1 by sputtering; (c) forming a first diamondlike carbon film 2a on the intermediate layer 2 by sputtering; and (d) forming a second diamondlike carbon film 2b on the first diamondlike carbon film 2a by cathode discharge type arc ion plating.

The substrate 1 described is prepared (step (a)).

The intermediate layer 2 is then formed on the substrate 1 by sputtering (step (b)).

Since various kinds of metals can be easily evaporated according to the sputtering, for example, intermediate layers containing various metals as the intermediate layers described in JP No. 2000-119843, U.S. Pat. No. 6,716,540 and JP No. 2003-171758 can be easily formed. Further, since the evaporation amount of metal can be extensively controlled by controlling the sputter power, an amorphous layer containing a metal contained in the intermediate layer and carbon (preferably an amorphous layer in which the concentration of the metal changes continuously or stepwise) can be easily formed. Although various metals can be evaporated by use of AIP, it is difficult to evaporate an extremely trace amount of metal by the AIP because a minimum current for keeping arc discharge in vacuum is present. Accordingly, it is difficult to form the intermediate layers described the three related arts by the AIP. Based on the above viewpoint, the intermediate layer is formed by use of sputtering in the present invention.

Concretely, for example, a Cr layer or W layer can be formed by sputtering in pure Ar atmosphere by use of a Cr target or W target.

The intermediate layer 2 is preferably formed by UBM sputtering. According to the UBM sputtering, in formation of the amorphous layer 22 (second layer) containing the first metal of W, Ta, Mo and Nb as in the first DLC formed body, for example, the homogeneous amorphous layer 22 can be obtained without forming carbides by the first metal which has high carbide forming capability.

In the formation of the intermediate layer 2, it is preferable to control the temperature of the substrate within the range from about 150° C. to 350° C. (preferably about 250° C. and 350° C.) in the stage of forming the first layer (in the first DLC formed body) or the first to third layers (in the second DLC formed body) to promote the diffusion to the substrate and layer-to-layer diffusion of the metal elements in the first layer. According to this, the adhesiveness of the first layer to the substrate and the layer-to-layer adhesiveness among the first layer to the third layer can be further improved. However, in the formation of the amorphous layer and the subsequent DLC film, the substrate temperature is preferably controlled to 300 to 100° C. (more preferably about 200 to 100° C.) because these layers are weak to heat.

When the stress relaxation layer is formed between the intermediate layer 2 and the DLC film 3, also, sputtering (preferably UBM sputtering) is employed. In order to control the hardness of the stress relaxation layer, the bias voltage to be applied to the iron-based substrate 1 is preferably controlled about within the range from −50V to −100V.

On the thus-formed intermediate layer 2 in which each layer is formed with good adhesiveness, the first DLC film 3a is formed by sputtering (preferably, by UBM sputtering) (step (c)). According to the UBM sputtering, the compact first DLC film 3a with high hardness can be formed. The details of the sputtering are the same as described in the step (b).

In the present invention, the steps of forming the intermediate layer 2 and the first DLC film 3a (including, if the stress relaxation layer is formed, the step of forming the stress relaxation layer) are preferably performed continuously by use of sputtering. According to this, since the interface between the amorphous layer which forms the intermediate layer and the first DLC film 3a is unclear, and the first DLC film 3a is also amorphous, the adhesiveness between the amorphous layer and the first DLC film 3 is also ensured. The UBM sputtering is more preferably employed in all of these steps.

The hardness of the first DLC film 3a can be enhanced, for example, by setting the bias voltage to be applied to the substrate high about within the range from −100V to −200V. Otherwise, the hardness can also be controlled by adjusting the hydrogen content of the first DLC film 3a, and if the hydrogen content is reduced, the hardness is increased. The hydrogen content of the first DLC film 3a is controlled to be about 5% to 20%.

On the first DLC film 3a, the second DLC film 3b is formed by cathode discharge type arc ion plating (AIP) (step (d)). According to this, an outermost surface layer excellent in wear resistance with high hardness (extremely high hardness close to that of diamond) which cannot be attained by the sputtering can be obtained. Since the AIP uses solid carbon as the evaporation source as described above, a film free from hydrogen can be formed, compared with the DLC film formed by CVD. Generally, the hardness of DLC film is greatly influenced by the hydrogen amount in the film, and it is known that as the hydrogen amount is smaller, a DLC film with higher hardness is formed.

The above-mentioned steps (b), (c) and (d) can be performed by use of a sputtering device and an AIP device separately. In this case, the intermediate layer 2 and the first DLC layer 3a are formed by use of the sputtering device. After releasing to the atmosphere, the second DLC film is formed separately by use of the AIP device. Otherwise, for further efficiently performing the film formation while preventing reduction in adhesiveness between the first and second DLC films as much as possible, a composite type coating device provided with both a sputtering evaporation source (preferably, UBM type sputtering evaporation source) and a cathode discharge type arc ion plating evaporation source within in one vacuum chamber is preferably used. According to this, the steps extending from the intermediate layer to the first and second DLC films can be continuously performed.

The structure and effect of the present invention will be further concretely described in reference to examples. The present invention is never limited to these examples, and can be carried out with proper modifications within the scope adaptable to the gist of the present invention, and such modifications are therefore intended to be embraced by the technical scope of the present invention.

EXAMPLE

DLC formed bodies (Nos. 1 to 11) having various film structures shown in Table 1 were produced in the following manner, and evaluated for adhesiveness to the DLC film. Among them, Nos. 2 to 6 and 8 to 11 are inventive examples which satisfy the requirements of the present invention, and Nos. 1 and 7 are comparative examples which do not satisfy the requirements of the present invention. Each of Nos. 2 to 6 has a two-layer intermediate layer, and each of Nos. 8 to 11 has a four-layer intermediate layer.

(Substrate)

As shown in Table 1, cemented carbide ("UT120T" manufactured by Mitsubishi Materials Corporation) was used in Nos. 1 to 6, while SUJ2 of JIS standard was used in Nos. 7 to 12. Each substrate has a size of 12 cm square and 5 mm thickness, with a mirror-polished surface (Ra=about 0.02 μm).

These substrates were ultrasonically washed using an alkali tank in and a pure water tank in advance, and dried.

Formation of Intermediate Layer and DLC Film (1) Nos. 2 to 6 and 8 to 11 (Inventive Examples)

Figure 5:
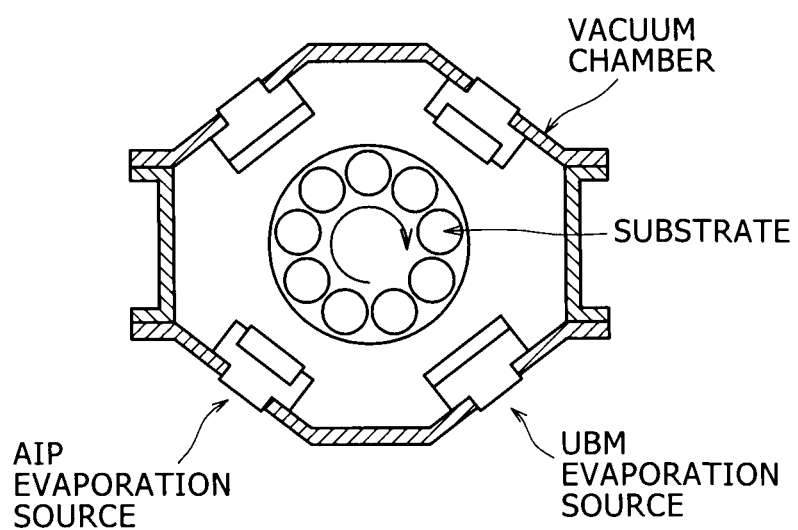
FIG. 5 is a schematic descriptive view showing an upper surface of a composite type coating device.

Using a composite type coating device having a plurality of evaporation sources shown in FIG. 5 ("AIP-S40HC" manufactured by Kobe Steel, Ltd.), the intermediate layer and the DLC film were formed as follows. The composite type coating device, as shown in FIG. 5, comprises an AIP evaporation source (target size: φ100 mm) and a UMB evaporation source (target size: 127 mm×508 mm).

Each substrate was set on a substrate stage within the composite coating device, and after the internal pressure of the device is reduced to vacuum of about $3\times10^{-3}$ Pa, the substrate was heated to about 150° C. by a heater to perform degassing of the substrate. The surface of the substrate was etched using Ar plasma. During the etching process, the temperature of the substrate is raised from 200 to 250° C. The intermediate layer and the first DLC film were formed using UBMS as shown in Table 1, and the second DLC film was formed using AIP.

Concretely, the intermediate layers of Nos. 2 to 6 were produced as follows.

The first layer was formed by UBMS using a target of a first layer metal (W, Ta, Mo or Nb) shown in Table 1 in pure Ar atmosphere. The second layer was then formed by UBMS using targets of a second layer metal (the same metal as in the first layer) and carbon (C). In No. 6, the content of W in the second layer was reduced continuously from the first layer side to the second layer side by adjusting the sputter power of the targets of W and carbon (C) to 4 kW to 0.1 kW and 0.1 kW to 6 kW, respectively.

In Nos. 8 to 11, the intermediate layer of four-layer structure was produced as follows.

The first layer was formed by UBMS using a target of a first layer metal shown in Table 1 (Cr or Al) in pure Ar atmosphere. The second layer was then formed by UBMS using targets of a first layer metal and a third layer metal (W or Ta) shown in Table 1. The third layer was formed by UBMS using a target of a third layer metal (W or Ta) shown in Table 1. The fourth layer was formed by UBMS using targets of a fourth layer metal (the same metal as the third layer) shown in Table 1 and carbon (C).

After forming the intermediate layer in this way, the DLC film of two-layer structure differed in hardness was formed as follows.

The first DLC film with low hardness (about 20 to 40 GPa) shown in Table 1 was formed by UBMS. Concretely, the formation of the first DLC film was performed in full pressure of 0.4 Pa of Ar or (Ar+CH4) mixed gas with input power to target of 6 kW. DC bias was applied within the range from −100V to −200V so that the substrate (the processing object) has a minus potential.

The second DLC film with high hardness (about 40 GPa to 80 GPa) was formed by AIP. Concretely, the formation was performed with an arc current to C target of 50 A, an Ar gas pressure of 0.1 Pa, and a DC bias voltage of −100V to 200V. In No. 11, the hardness of the second DLC film was controlled so as to increase from the interface side with the first DLC film to the outermost layer side of the second DLC film by continuously changing the bias voltage from −50V to −150V.

(2) Nos. 1 and 7 (Comparative Examples)

As shown in Table 1, the intermediate layer and the DLC film were formed using AIP. As the device, the composite type coating device was used similarly to (1), and the AIP evaporation source thereof was used. The detailed forming method is as follows.

The intermediate layer (mixed layer) was formed in a thickness of 100 nm with a bias voltage of −800V while discharging a C target with an arc current of 50 A in the atmosphere of Ar pressure of 0.1 Pa, and the DLC film was formed thereafter with a bias voltage of −200V.
(Measurement of Hardness)

The surface hardness of the intermediate layer and the DLC film was measured by use of a nano indentation system (nano indentation tester "ENT-1100a" manufactured by Elionix Inc.). The sample was fixed to a measurement holder by use of an instant adhesive, mounted on a heating stage, and held thereon at 26° C. for 30 minutes or more, and at the time when the temperature difference between the device and the sample disappeared, the hardness after correction of the influence of an indenter shape was measured at a load of 200 mg to 2 g.
(Evaluation Method)

With respect to each of the thus-obtained formed bodies shown in Table 1, LEVETEST scratch test was performed as described below to evaluate the adhesiveness to the DLC film (critical load).
(Scratch Test)

Each formed body was fixed to a moving stage, and the moving stage was moved at a rate of 10 mm/min while loading the surface of each formed body by use of a diamond indenter at a load rate of 100 N/min. Scratch flaws formed on each formed body was observed by an optical microscope (magnification: 200-fold) to measure the critical load (N) of scratch which causes separation of DLC film.

These results are also shown in Table 1.

TABLE 1

| | | | Intermediate layer | | | | | First DLC film | | | Second DLC film | | Total | Scratch |
| | | | | | | | | | | | | | | |
| No. | Substrate | Process | 1st layer | 2nd | 3rd | 4th | Thickness (μm) | Process | Hardness (GPa) | Thickness (μm) | Process | Hardness (GPa) | Thickness (μm) | thickness (μm) | critical load (N) |
|---|---|---|---|---|---|---|---|---|---|---|---|---|---|---|---|
| 1 | WC—Co | AIP | W/C | | — | — | 0.01 | — | — | — | AIP | 60 | 3.1 | 3.1 | 55 |
| 2 | WC—Co | UBMS | W | W/C | — | — | 0.5 | UBMS | 30 | 1.0 | AIP | 60 | 1.5 | 3.0 | 82 |
| 3 | WC—Co | UBMS | Ta | Ta/C | — | — | 0.6 | UBMS | 30 | 1.1 | AIP | 60 | 1.4 | 3.1 | 77 |
| 4 | WC—Co | UBMS | Mo | Mo/C | — | — | 0.4 | UBMS | 30 | 1.2 | AIP | 60 | 1.5 | 3.1 | 78 |
| 5 | WC—Co | UBMS | Nb | Nb/C | — | — | 0.5 | UBMS | 30 | 1.0 | AIP | 60 | 1.5 | 3.0 | 78 |
| 6 | WC—Co | UBMS | W | W/C (inclination) | — | — | 1.0 | UBMS | 40 | 1.0 | AIP | 40 to 80 | 1.2 | 3.2 | 80 |

TABLE 1-continued

| | | | Intermediate layer | | | | | DLC film | | | | | | |
|---|---|---|---|---|---|---|---|---|---|---|---|---|---|---|---|
| | | | | | | | | | First DLC film | | | Second DLC film | | Total | Scratch |
| No. | Substrate | Process | 1st layer | 2nd | 3rd | 4th | Thickness (μm) | Process | Hardness (GPa) | Thickness (μm) | Process | Hardness (GPa) | Thickness (μm) | thickness (μm) | critical load (N) |
| 7 | SUJ2 | AIP | Fe/C | — | — | — | 0.01 | — | — | — | AIP | 60 | 3.0 | 3.0 | 35 |
| 8 | SUJ2 | UBMS | Cr | Cr/W | W | W/C | 0.8 | UBMS | 20 | 0.5 | AIP | 65 | 1.8 | 3.1 | 60 |
| 9 | SUJ2 | UBMS | Al | Al/W | W | W/C | 1.0 | UBMS | 20 | 0.7 | AIP | 65 | 1.3 | 3.0 | 61 |
| 10 | SUJ2 | UBMS | Cr | Cr/W | Ta | Ta/C | 0.6 | UBMS | 20 | 0.6 | AIP | 60 | 1.8 | 3.0 | 58 |
| 11 | SUJ2 | UBMS | Cr | Cr/W | W | W/C | 1.0 | UBMS | 40 | 1.0 | AIP | 40 to 80 | 1.2 | 3.2 | 55 |

From Table 1, the followings can be considered.

In the inventive examples Nos. 2 to 6 and 8 to 11 which satisfy the requirements of the present invention, even if a DLC multilayer film having high-hardness DLC film as an outermost layer is formed in a thickness of about 3 μm, excellent adhesiveness could be exhibited. In detail, the scratch critical load was not less than 77 N in Nos. 2 to 6 using the cemented carbide substrate, and not less than 55 N in Nos. 8 to 11 using the iron-based substrate, and extremely high adhesive strength could be obtained.

In contrast to this, Nos. 1 and 7 are comparative examples in which the DLC film is composed of only one layer, and only the amorphous layer is formed between the DLC film and the substrate without metal layer. In each of these comparative examples, the scratch critical load was less than 60 N in the cemented carbide substrate and less than 40 N in the iron-based substrate, and the adhesiveness to DLC film was inferior.

The invention claimed is:

1. A method for producing a diamondlike carbon hard multilayer film formed body, the method comprising forming an intermediate layer on a substrate by sputtering;
  forming a first diamondlike carbon film on the intermediate layer by sputtering; and
  forming a second diamondlike carbon film on the first diamondlike carbon film by cathode discharge type arc ion plating, thereby forming the diamondlike carbon hard multilayer film formed body;
  wherein the diamondlike carbon hard multilayer film comprises
  the substrate,
  a diamondlike carbon film comprising mainly diamondlike carbon, and
  the intermediate layer between the substrate and the diamondlike carbon film;
  wherein the diamondlike carbon film comprises, in order from the substrate, the first diamondlike carbon film and the second diamondlike carbon film,
  wherein a surface hardness of the first diamondlike carbon film ranges from not less than 10 GPa to not more than 40 GPa, based on nanoindentation test, and
  wherein a surface hardness of the second diamondlike carbon film ranges from more than 40 GPa to not more than 90 GPa based on nanoindentation test,
  wherein the first diamondlike carbon film has a thickness of from 0.5 to 1.2 μm; the second diamondlike carbon film has a thickness larger than 1.2 and 3.1 μm or less.

2. The method of claim 1, wherein a composite type coating device having a sputtering evaporation source and a cathode discharge type arc ion plating evaporation source provided within one vacuum chamber is employed in the forming the intermediate layer on the substrate, the forming the first diamondlike carbon film, and the forming the second diamondlike carbon film.

3. The method of claim 1, wherein the forming the intermediate layer by sputtering comprises a forming process by unbalanced magnetron sputtering.

4. The method of claim 1, wherein the forming the first diamondlike carbon film by sputtering comprises a forming process by unbalanced magnetron sputtering.

5. The method of claim 2, wherein the composite type coating device comprises an unbalanced magnetron type sputtering evaporation source.

6. The method of claim 1, wherein in the diamondlike carbon hard multilayer film filmed formed body, the surface hardness of the first diamondlike carbon film ranges from not less than 20 GPa to not more than 30 GPa, based on nanoindentation test.

7. The method of claim 1, wherein in the diamondlike carbon hard multilayer film formed body, the surface hardness of the second diamondlike carbon film ranges from not less than 50 GPa to not more than 80 GPa.

8. The method of claim 1, wherein in the diamondlike carbon hard multilayer film formed body, a surface hardness of the second diamondlike carbon film increases continuously from an interface between the first diamondlike carbon film and the second diamondlike carbon film toward an outermost surface of the second diamondlike carbon film.

9. The method of claim 1, wherein in the diamondlike carbon hard multilayer film formed body, a surface hardness of the second diamondlike carbon film increases stepwise from an interface between the first diamondlike carbon film and the second diamondlike carbon film toward an outermost surface of the second diamondlike carbon film.

10. The method of claim 1, wherein in the diamondlike carbon hard multilayer film formed body, the first diamondlike carbon film is composed only of diamondlike carbon.

11. The method of claim 1, wherein in the diamondlike carbon hard multilayer film formed body, the first diamondlike carbon film comprises, in addition to diamondlike carbon, at least one metal.

12. The method of claim 11, wherein the first diamondlike film comprises the at least one metal in an amount ranging from not less than 5 atomic % to not more than 20 atomic %.

13. The method of claim 11, wherein the at least one metal is selected from the group consisting of W, Ta, Mo, Nb, Cr, Al, and combinations thereof.

14. The method of claim 12, wherein the at least one metal is selected from the group consisting of W, Ta, Mo, Nb, Cr, Al, and combinations thereof.

15. The method of claim 1, wherein in the diamondlike carbon hard multilayer film formed body, the substrate comprises a material selected from the group consisting of SiC, $Al_2O_3$, cemented carbide, thermet, a ceramic material, and combinations thereof.

16. The method of claim 15, wherein the substrate comprises the cemented carbide.

17. The method of claim 15, wherein the substrate comprises the ceramic material.

18. The method of claim 1, wherein in the diamondlike carbon hard multilayer film formed body, the intermediate layer comprises a first metal layer and an amorphous layer.

19. The method of claim 18,
wherein the first metal layer comprises at least one metal selected from the group consisting of W, Ta, Mo, Nb, and combinations thereof; and
wherein the amorphous layer comprises at least one metal selected from the group consisting of W, Ta, Mo, Nb, and combinations thereof; and further comprises C.

20. The method of claim 1, wherein in the diamondlike carbon hard multilayer film formed body, a thickness of the intermediate layer ranges from not less than 10% to not more than 50%, relative to the total thickness of the diamondlike carbon hard multilayer film formed body, and a thickness of the second diamondlike carbon film ranges from not less than 50% to note more than 90%, relative to the total thickness of the diamondlike carbon hard multilayer film formed body excepting the intermediate layer.

* * * * *